United States Patent
Choi et al.

(10) Patent No.: US 8,699,232 B2
(45) Date of Patent: Apr. 15, 2014

(54) INTEGRATED CIRCUIT PACKAGING SYSTEM WITH INTERPOSER AND METHOD OF MANUFACTURE THEREOF

(75) Inventors: A Leam Choi, Ichon-si (KR); DeokKyung Yang, Hanam-si (KR); JoHyun Bae, Seoul (KR)

(73) Assignee: Stats Chippac Ltd., Singapore (SG)

( * ) Notice: Subject to any disclaimer, the term of this patent is extended or adjusted under 35 U.S.C. 154(b) by 174 days.

(21) Appl. No.: 13/237,918

(22) Filed: Sep. 20, 2011

(65) Prior Publication Data

US 2013/0070438 A1  Mar. 21, 2013

(51) Int. Cl.
H05K 7/00 (2006.01)
(52) U.S. Cl.
USPC ............ 361/760; 361/767; 361/807; 438/18; 257/E21.502
(58) Field of Classification Search
USPC ............ 438/18; 257/E21.502; 361/760, 767, 361/807
See application file for complete search history.

(56) References Cited

U.S. PATENT DOCUMENTS

| | | | |
|---|---|---|---|
| 7,800,212 B2 | 9/2010 | Yoon et al. | |
| 2006/0220257 A1* | 10/2006 | Lee | 257/777 |
| 2007/0037319 A1* | 2/2007 | Chan et al. | 438/108 |
| 2008/0074852 A1* | 3/2008 | Lee | 361/749 |
| 2009/0091015 A1 | 4/2009 | Shen et al. | |
| 2009/0236718 A1* | 9/2009 | Yang et al. | 257/686 |
| 2010/0301469 A1 | 12/2010 | Choi et al. | |

* cited by examiner

*Primary Examiner* — Timothy Thompson
*Assistant Examiner* — Andargie M Aychillhum
(74) *Attorney, Agent, or Firm* — Ishimaru & Associates LLP (57) ABSTRACT

A method of manufacture of an integrated circuit packaging system includes: providing a substrate; mounting an interposer having a top interposer surface over the substrate; attaching an interposer pad extension to the top interposer surface, the interposer pad extension having an extension contact surface and a lower contact surface, the surface area of the extension contact surface being smaller than the surface area of the lower contact surface; and forming a package encapsulation on the substrate, the interposer, and the interposer pad extension, the package encapsulation having a recess exposing the top interposer surface, the interposer pad extension embedded only in the package encapsulation.

9 Claims, 3 Drawing Sheets

INTEGRATED CIRCUIT PACKAGING SYSTEM WITH INTERPOSER AND METHOD OF MANUFACTURE THEREOF

TECHNICAL FIELD

The present invention relates generally to an integrated circuit packaging system, and more particularly to a system with an interposer.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for stacking more components together influences manufacturing processes.

Thus, a need still remains for a more efficient method of stacking components. In view of the increasing cost of materials, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting an interposer having a top interposer surface over the substrate; attaching an interposer pad extension to the top interposer surface, the interposer pad extension having an extension contact surface and a lower contact surface, the surface area of the extension contact surface being smaller than the surface area of the lower contact surface; and forming a package encapsulation on the substrate, the interposer, and the interposer pad extension, the package encapsulation having a recess exposing the top interposer surface, the interposer pad extension embedded only in the package encapsulation.

The present invention provides an integrated circuit packaging system, including: a substrate; an interposer over the substrate, the interposer having a top interposer surface; an interposer pad extension attached to the top interposer surface, the interposer pad extension having an extension contact surface and a lower contact surface, the surface area of the extension contact surface being smaller than the surface area of the lower contact surface; and a package encapsulation on the substrate, the interposer, and the interposer pad extension, the package encapsulation having a recess exposing the top interposer surface, the interposer pad extension embedded only in the package encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the mounting plane or surface of the interposer that has an electrical contact regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Figure 1:
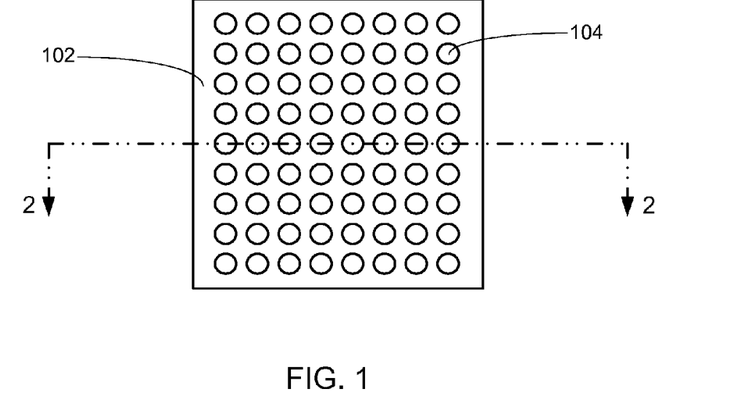
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. The integrated circuit packaging system 100 is shown having a chip carrier 102 and an external interconnect 104. The chip carrier 102 is defined as a structure containing conductive traces and contacts. For example, the chip carrier 102 can be a laminate substrate, a ceramic substrate, a silicon substrate, a leadframe, or some other structure for redistribution of signals. The external interconnect 104 can be attached to the system side of the chip carrier 102.

The external interconnect 104 is defined as an interface connector for connecting an integrated circuit package to a next level system (not shown). For example, the external interconnect 104 can be a solder ball, a solder bump, a stud bump, a conductive pillar, or other conductive structure.

Figure 2:
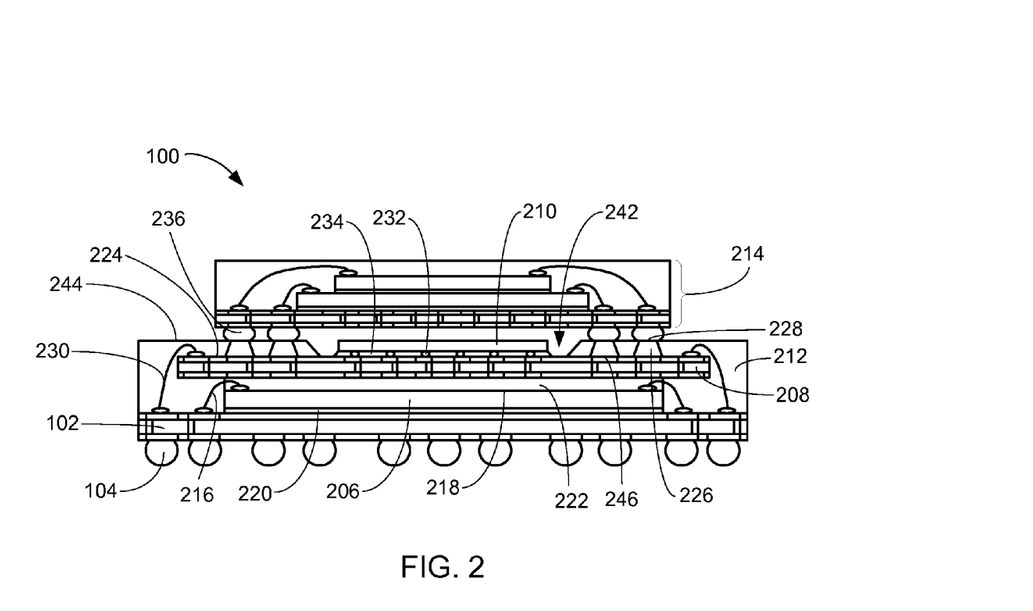
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having a base die 206, an interposer 208, an integrated circuit die 210, a package encapsulation 212, and an integrated circuit device 214, as an example.

The base die 206 can be mounted on the chip carrier 102 and connected to the chip carrier 102 with a base interconnect 216. The base interconnect 216 is defined as an electrical connector. For example, the base die 206 can be a wire-bond chip and the base interconnect 216 can be a bond wire or bond ribbon. The base die 206 can have a top die surface 218 such as an active side having active circuitry fabricated thereon. The base die 206 can have a non-active side. The non-active side of the base die 206 can be attached to the chip carrier 102 with a base adhesive 220, such as a die attach adhesive, and adhesive paste, or an underfill. The top die surface 218 of the base die 206 can be connected to the chip carrier 102 by the base interconnect 216. The chip carrier 102 is shown with contacts and vias clearly delineated for illustrative purposes but it is understood that the top and the bottom of the chip carrier 102 are electrically connected through contacts, vias, traces, or other conductive structures.

The top die surface 218 is defined as the surface of the base die 206 facing away from the chip carrier 102. The top die surface 218 can be completely covered by an interposer adhesive 222. The interposer adhesive 222 is defined as a sticky material for attaching components to each other. For example, the interposer adhesive 222 can be a wire-in-film adhesive, which is defined as a B-stage material. The base interconnect 216, such as a bond wire, can be partially embedded in the interposer adhesive 222.

The interposer 208 can attach to the base die 206 with the interposer adhesive 222. The interposer 208 can be positioned on the interposer adhesive 222. The interposer 208 is defined as a structure having contacts and traces for redistributing signals. For example, the interposer 208 can be a laminated substrate, a ceramic substrate, or other structure for redistribution of signals. The interposer 208 can have horizontal dimensions larger than the base die 206. The bottom surface of the interposer 208 can be partially or fully covered by the interposer adhesive 222. The interposer adhesive 222 can fill the available space between the interposer 208 and the base die 206.

For illustrative purposes, the bottom surface of the interposer 208 is shown as being partially covered by the interposer adhesive 222, though it is understood that the interposer adhesive 222 can take different configurations. For example, the bottom surface of the interposer 208 can be fully covered by the interposer adhesive 222. The full coverage of the bottom surface of the interposer 208 can result from applying the interposer adhesive 222 to the interposer 208 before singulation of individual units of the interposer 208 followed by singulation and then mounting the interposer on the base die 206. The preceding process can result in more efficient manufacturing because the amount of the interposer adhesive 222 does not need to be as carefully controlled when applying the interposer adhesive 222 to the interposer 208 before singulation.

The interposer 208 can have a top interposer surface 224. The top interposer surface 224 is the side of the interposer 208 facing away from the base die 206. The top interposer surface 224 can have an interposer pad extension 226 attached to a contact pad on the periphery of the top interposer surface 224.

The interposer pad extension 226 is defined as an electrically conductive metallic structure attractive to solder which is larger at the bottom than the top. For example, the interposer pad extension 226 can be made from copper or a copper alloy of the same composition as the contact pads on the interposer 208. Also for example, the interposer pad extension 226 can be shaped with slanted sides so that the width of the side contacting the interposer 208 can be larger than the width of the exposed top surface of the interposer pad extension 226. The interposer pad extension 226 can be shaped like a pyramid or a cone with the small end cut off to leave a flat surface parallel to the bottom of the pyramid or the cone.

The interposer pad extension 226 can be formed before being attached to the interposer 208. The interposer pad extension 226 can be attached to a contact pad on the periphery of the top interposer surface 224. The interposer pad extension 226 can be formed and attached in various ways. For example, the interposer pad extension 226 can be formed and attached by masking and plating or depositing, or by forming separately followed by attaching by an adhesive layer.

It has been discovered that the interposer pad extension 226 being formed from the same copper or copper alloy as the contact pads on the interposer 208 can prevent damage from thermal expansion and contraction. For example, because the interposer pad extension 226 has the same coefficient of thermal expansion as the contact pads on the interposer 208, heating and cooling will not cause cracking or separation between the interposer pad extension 226 and the contact pads on the interposer 208.

It has also been discovered that the interposer pad extension 226 being formed from the same copper or copper alloy as the contact pads on the interposer 208 can prevent damage from electromigration. For example, because electromigration will occur more quickly between dissimilar metals, the similar metals of the interposer pad extension 226 and the contact pads on the interposer 208 will alleviate electrolytic damage to the connection between the interposer pad extension 226 and the interposer 208.

It has been further discovered that the interposer pad extension 226 being formed from copper or a copper alloy can prevent inadvertent shorts during reflow of solder on the interposer pad extensions 226. For example, because copper has a higher melting point than solder, the interposer pad extension 226 will remain solid during a reflow process and the attraction of the solder to the interposer pad extension 226 will prevent the solder from bleeding out over the package encapsulation 212 and causing electrical shorts.

The interposer pad extension 226 can include an extension contact surface 228, which is defined to be a top surface of the interposer pad extension 226. The extension contact surface 228 can be exposed from the package encapsulation 212. The extension contact surface 228 can be coated to prevent corrosion with a conductive material such as gold. For example, the surface area of the extension contact surface 228 can be half as large as the surface area of the bottom of the interposer pad extension 226. The extension contact surface 228 can be attractive to solder unlike the package encapsulation 212, which can help prevent electrical shorts from solder bridging between two contacts.

The interposer pad extension 226 can include a lower contact surface 246, which is defined as the bottom surface of the interposer pad extension 226 that connects directly to the interposer 208. The lower contact surface 246 can be larger in surface area than the extension contact surface 228. For example, the lower contact surface 246 can have twice the surface area as the extension contact surface 228.

The interposer 208 can be connected to the chip carrier 102 by an interposer interconnect 230. The interposer interconnect 230 can be on the top interposer surface 224 and the chip carrier 102. For example, the interposer interconnect 230 can be a bond wire or a ribbon bond wire. The interposer interconnect 230 can attach to a contact pad at the edge of the top interposer surface 224. Also for example, the interposer interconnect 230 can be connected on the chip carrier 102 on a contact pad beyond the peripheral edge of the top interposer surface 224.

The interposer 208, the interposer interconnect 230, the interposer pad extension 226, and the base die 206 can be at least partially covered by and can contact the package encapsulation 212. The package encapsulation 212 is defined as a structure on integrated circuit components for electrical and environmental protection and to provide a hermetic seal. For example, the package encapsulation 212 can be a film assisted molding, epoxy molding, or other protective molding, and can protect sensitive components from moisture, dust and other contamination.

The interposer interconnect 230 and the base die 206 can be fully covered by the package encapsulation 212. The top surface of the chip carrier 102 on which the base die 206 is mounted can be fully covered by the package encapsulation 212. The package encapsulation 212 can be formed (or molded) to completely cover the non-horizontal sides of the interposer pad extension 226, which can leave the extension contact surface 228 exposed for connection to other components such as the integrated circuit device 214. The extension contact surface 228 can be coplanar with the top surface of the package encapsulation 212.

The interposer pad extension 226 can be embedded in the package encapsulation 212 in various ways. For example, the interposer pad extension 226 can be pre-formed, attached to the top interposer surface 224, and then covered by the package encapsulation 212 while leaving the extension contact surface 228 exposed. The top of the package encapsulation 212 can be planarized if necessary to expose the top of the interposer pad extension 226.

It has been discovered that the interposer pad extension 226 with the extension contact surface 228 having a surface area that is half of the lower contact surface 246 can help to stabilize the interposer 208 in the package encapsulation 212 and prevent warpage. For example, the shape of the interposer pad extension 226 wider on the bottom than the top can serve a mold locking function.

It has been discovered that forming the package encapsulation 212 on the interposer 208 and the interposer pad extension 226 can prevent resin bleeding during laser ablation. For example, by forming the package encapsulation 212 on the interposer pad extension 226 rather than using a laser to ablate a hole in the package encapsulation 212, there will be no residue to bleed because forming a hole will be unnecessary.

The package encapsulation 212 can cover the periphery of the interposer 208 while leaving the center of the top interposer surface 224 exposed in a recess 242 of the package encapsulation 212. The recess 242 can span a vertical distance from the top interposer surface 224 to the top of the package encapsulation 212.

The recess 242 can have outwardly slanted non-horizontal sides formed by the package encapsulation 212 in order to allow for easier placement of the integrated circuit die 210. The exposed contacts of the interposer 208 in the recess 242 can be used for mounting an integrated circuit, such as the integrated circuit die 210, a flip chip, or a packaged integrated circuit. The package encapsulation 212 can have a top encapsulation surface 244, which is defined as the planar surface of the package encapsulation 212 furthest from the chip carrier 102.

It has been discovered that the package encapsulation 212 covering all but the center of the interposer 208 can allow the use of a thinner substrate material in the construction of the interposer 208. For example, because most of the interposer 208 is surrounded by the package encapsulation 212, the interposer 208 can be more resistant to warpage and bending as the interposer 208 can be supported by the package encapsulation 212.

The interposer pad extensions 226 can be in an array around the recess 242 as a regular, staggered, or differently patterned array. For illustrative purposes, the interposer pad extensions 226 are shown in two rows, although it is understood that any number of rows is possible. For example, there can just be one row, three rows, or as many rows as is possible to fit in the space given pitch and sizing requirements.

The array of the interposer pad extensions 226 can have the extension contact surfaces 228 all coplanar with each other and with the top encapsulation surface 244. The extension contact surfaces 228 of the interposer pad extensions 226 can have a fine pitch because the package encapsulation 212 between the extension contact surfaces 228 will not attract a solder ball on the extension contact surface 228, for example. Pitch is defined as the spacing from center to center of the extension contact surfaces 228. The extension contact surface 228 and the package encapsulation 212 together can reduce the chance of a short due to solder bridging between adjacent instances of the extension contact surface 228.

The integrated circuit die 210 can be mounted, in the recess 242, on the top interposer surface 224 of the interposer 208 and electrically connected to the interposer 208 using a chip interconnect 232. There can be an upper adhesive 234 between the integrated circuit die 210 and the interposer 208. The upper adhesive is defined as an adhesive material for stabilizing the integrated circuit die 210 on the interposer 208. For example, the upper adhesive 234 can be an underfill. The upper adhesive 234 can surround and support the chip interconnect 232. For example, the chip interconnect 232 can be a solder ball, a conductive bump, or a metal pillar. The chip interconnect 232 can, in this example, be in between and in contact with the integrated circuit die 210 and the interposer 208 for forming an electrical connection.

The upper adhesive 234 can extend to or past the edge of the integrated circuit die 210 in order to ensure proper adhesion. The upper adhesive 234 can contact the integrated circuit die 210 and the interposer 208 and can, but does not have to, contact the package encapsulation 212.

The integrated circuit device 214 can be mounted above the integrated circuit die 210 and on the top of the interposer pad extension 226. The integrated circuit device 214 can be connected to the interposer pad extension 226 by a device interconnect 236. The device interconnect 236 is defined as an electrical connector for the integrated circuit device 214 that also provides a support function. For example, the device interconnect 236 can be a solder ball, a conductive column, or a metal pillar.

The integrated circuit device 214 can be in various configurations. For example, the integrated circuit device can be a single chip package, a multiple chip package, a package-in-package, a package-on-package, or other package having active circuitry. In this example, the integrated circuit device 214 can have two chips, with the upper chip smaller than the lower chip, both connected to a device substrate by bond wires. A device encapsulation can cover the chips, the bond wires, and the die attach side of the device substrate. The upper chip and the lower chip of the integrated circuit device 214 can be electrically connected to the base die 206, the integrated circuit die 210, the external interconnect 104, or a combination thereof by being coupled through the interposer pad extension 226.

It has been discovered that the use of the interposer pad extension 226 to create a multi-level package without the use of an additional interposer can reduce the size of the integrated circuit packaging system 100 and can simplify manufacturing and lower cost. For example, because an additional interposer is unnecessary, the height of the integrated circuit packaging system 100 can be less as compared to a package having two interposers. Also for example, as the integrated circuit packaging system 100 only requires one instance of the interposer 208 with the interposer pad extension 226, material costs can also be decreased. Reliability can also be increased due to decreased complexity of the integrated circuit packaging system 100 with the interposer 208 and the recess 242 in the package encapsulation 212.

Figure 3:
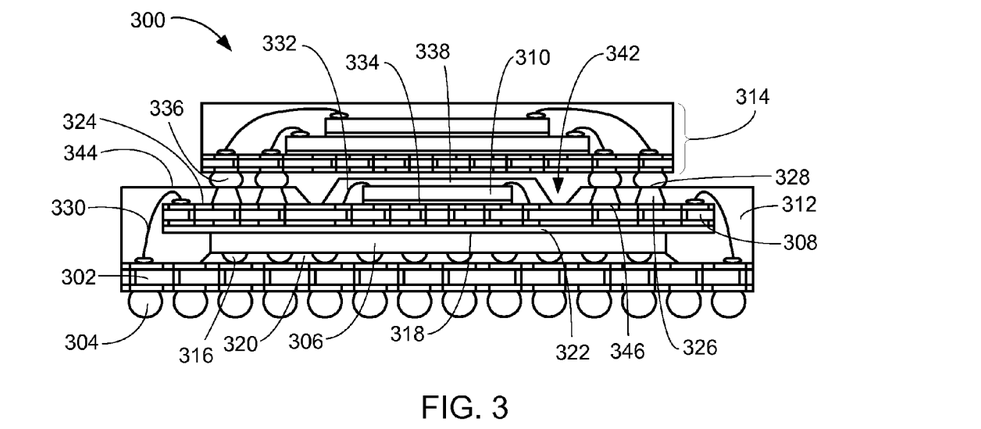
FIG. 3 is a cross-sectional view of an integrated circuit packaging system as exemplified by the bottom view of FIG. 1 and along the section line 2-2 of FIG. 1 in a second embodiment of the present invention.

Referring now to FIG. 3, therein is shown a cross-sectional view of an integrated circuit packaging system 300 as exemplified by the bottom view of FIG. 1 and along the section line 2-2 of FIG. 1 in a second embodiment of the present invention. The integrated circuit packaging system 300 is shown having a chip carrier 302, a base die 306, an interposer 308, an integrated circuit die 310, a package encapsulation 312, and an integrated circuit device 314, as an example.

The chip carrier 302 is defined as a structure containing conductive traces and contacts. For example, the chip carrier 302 can be a laminate substrate, a ceramic substrate, a silicon substrate, a leadframe, or some other structure for redistribution of signals. An external interconnect 304 can be attached to the system side of the chip carrier 302.

The external interconnect 304 is defined as an interface connector for connecting an integrated circuit package to a next level system (not shown). For example, the external interconnect 304 can be a solder ball, a solder bump, a stud bump, a conductive pillar, or other conductive structure.

The base die 306 can be mounted on the chip carrier 302 and connected to the chip carrier 302 with a base interconnect 316. The base interconnect 316 is defined as an electrical connector. For example, the base die 306 can be a flip chip and the base interconnect 316 can be a solder ball, metal bump, or conductive column. The base die 306 can have a top die surface 318 such as a non-active side. The base die 306 can have an active side having active circuitry fabricated thereon facing the chip carrier 302. The active side of the base die 306 can be attached to the chip carrier 302 with the base interconnect 316. A base adhesive 320, such as an underfill or an adhesive paste, can be on and between the base die 306 and the chip carrier 302.

The chip carrier 302 is shown with contacts and vias clearly delineated for illustrative purposes but it is understood that the top and the bottom of the chip carrier 302 are electrically connected through contacts, vias, traces, or other conductive structures.

The top die surface 318 is defined as the surface of the base die 306 facing away from the chip carrier 302. The top die surface 318 can be completely covered by an interposer adhesive 322. The interposer adhesive 322 is defined as a sticky material for attaching components to each other. For example, the interposer adhesive 322 can be a die attach adhesive or adhesive paste. The interposer adhesive 322 can be applied first to the interposer 308 and can fully cover the side of the interposer 308, which attaches to the base die 306.

The interposer 308 can attach to the base die 306 with the interposer adhesive 322. The interposer 308 can be positioned on the interposer adhesive 322. The interposer 308 is defined as a structure having contacts and traces for redistributing signals. For example, the interposer 308 can be a laminated substrate, a ceramic substrate, or other structure for redistribution of signals. The interposer 308 can have horizontal dimensions larger than the base die 306. The bottom surface of the interposer 308 can be partially or fully covered by the interposer adhesive 322. The interposer adhesive 322 can fill the available space between the interposer 308 and the base die 306.

The interposer 308 can have a top interposer surface 324. The top interposer surface 324 is the side of the interposer 308 facing away from the base die 306. The top interposer surface 324 can have an interposer pad extension 326 attached to a contact pad on the periphery of the top interposer surface 324.

The interposer pad extension 326 is defined as an electrically conductive metallic structure attractive to solder which is larger at the bottom than the top. For example, the interposer pad extension 326 can be made from copper or a copper alloy of the same composition as the contact pads on the interposer 308. Also for example, the interposer pad extension 326 can be shaped with slanted sides so that the width of the side contacting the interposer 308 can be larger than the width of the exposed top surface of the interposer pad extension 326. The interposer pad extension 326 can be shaped like a pyramid or a cone with the small end cut off to leave a flat surface parallel to the bottom of the pyramid or the cone.

The interposer pad extension 326 can be formed before being attached to the interposer 308. The interposer pad extension 326 can be attached to a contact pad on the periphery of the top interposer surface 324. The interposer pad extension 326 can be formed and attached in various ways. For example, the interposer pad extension 326 can be formed and attached by masking and plating or depositing, or by forming separately followed by attaching by an adhesive layer.

It has been discovered that the interposer pad extension 326 being formed from the same copper or copper alloy as the contact pads on the interposer 308 can prevent damage from thermal expansion and contraction. For example, because the interposer pad extension 326 has the same coefficient of thermal expansion as the contact pads on the interposer 308, heating and cooling will not cause cracking or separation between the interposer pad extension 326 and the contact pads on the interposer 308.

It has also been discovered that the interposer pad extension 326 being formed from the same copper or copper alloy as the contact pads on the interposer 308 can prevent damage from electromigration. For example, because electromigration will occur more quickly between dissimilar metals, the similar metals of the interposer pad extension 326 and the contact pads on the interposer 308 will alleviate electrolytic damage to the connection between the interposer pad extension 326 and the interposer 308.

It has been further discovered that the interposer pad extension 326 being formed from copper or a copper alloy can prevent inadvertent shorts during reflow of solder on the interposer pad extensions 326. For example, because copper has a higher melting point than solder, the interposer pad extension 326 will remain solid during a reflow process and the attraction of the solder to the interposer pad extension 326 will prevent the solder from bleeding out over the package encapsulation 312 and causing electrical shorts.

The interposer pad extension 326 can include an extension contact surface 328, which is defined to be a top surface of the interposer pad extension 326. The extension contact surface 328 can be exposed from the package encapsulation 312. The extension contact surface 328 can be coated to prevent corrosion with a conductive material such as gold. For example, the surface area of the extension contact surface 328 can be half as large as the surface area of the bottom of the interposer pad extension 326. The extension contact surface 328 can be attractive to solder unlike the package encapsulation 312, which can help prevent electrical shorts from solder bridging between two contacts.

The interposer pad extension 326 can include a lower contact surface 346, which is defined as the bottom surface of the interposer pad extension 326 that connects directly to the interposer 308. The lower contact surface 346 can be larger in surface area than the extension contact surface 328. For example, the lower contact surface 346 can have twice the surface area as the extension contact surface 328.

The interposer 308 can be connected to the chip carrier 302 by an interposer interconnect 330. The interposer interconnect 330 can be on the top interposer surface 324 and the chip carrier 302. For example, the interposer interconnect 330 can be a bond wire or a ribbon bond wire. The interposer interconnect 330 can attach to a contact pad at the edge of the top interposer surface 324. Also for example, the interposer interconnect 330 can be connected on the chip carrier 302 on a contact pad beyond the peripheral edge of the top interposer surface 324.

The interposer 308, the interposer interconnect 330, the interposer pad extension 326, and the base die 306 can be at least partially covered by and can contact the package encapsulation 312. The package encapsulation 312 is defined as a structure on integrated circuit components for electrical and environmental protection and to provide a hermetic seal. For example, the package encapsulation 312 can be a film assisted molding, epoxy molding, or other protective molding, and can protect sensitive components from moisture, dust and other contamination.

The interposer interconnect 330 and the base die 306 can be fully covered by the package encapsulation 312. The top surface of the chip carrier 302 on which the base die 306 is mounted can be fully covered by the package encapsulation 312. The package encapsulation 312 can be formed (or molded) to completely cover the non-horizontal sides of the interposer pad extension 326, which can leave the extension contact surface 328 exposed for connection to other components such as the integrated circuit device 314. The extension contact surface 328 can be coplanar with the top surface of the package encapsulation 312.

The interposer pad extension 326 can be embedded in the package encapsulation 312 in various ways. For example, the interposer pad extension 326 can be pre-formed, attached to the top interposer surface 324, and then covered by the package encapsulation 312 while leaving the extension contact surface 328 exposed. The top of the package encapsulation 312 can be planarized if necessary to expose the top of the interposer pad extension 326.

It has been discovered that the interposer pad extension 326 with the extension contact surface 328 having a surface area that is half of the lower contact surface 346 can help to stabilize the interposer 308 in the package encapsulation 312 and prevent warpage. For example, the shape of the interposer pad extension 326 wider on the bottom than the top can serve a mold locking function.

It has been discovered that forming the package encapsulation 312 on the interposer 308 and the interposer pad extension 326 can prevent resin bleeding during laser ablation. For example, by forming the package encapsulation 312 on the interposer pad extension 326 rather than using a laser to ablate a hole in the package encapsulation 312, there will be no residue to bleed because forming a hole will be unnecessary.

The package encapsulation 312 can cover the periphery of the interposer 308 while leaving the center of the top interposer surface 324 exposed in a recess 342 of the package encapsulation 312. The recess 342 can span a vertical distance from the top interposer surface 324 to the top of the package encapsulation 312.

The recess 342 can have outwardly slanted non-horizontal sides formed by the package encapsulation 312 in order to allow for easier placement of the integrated circuit die 310. The exposed contacts of the interposer 308 in the recess 342 can be used for mounting an integrated circuit, such as the integrated circuit die 310, a wire-bond chip, or a packaged integrated circuit. The package encapsulation 312 can have a top encapsulation surface 344, which is defined as the planar surface of the package encapsulation 312 furthest from the chip carrier 302.

It has been discovered that the package encapsulation 312 covering all but the center of the interposer 308 can allow the use of a thinner substrate material in the construction of the interposer 308. For example, because most of the interposer 308 is surrounded by the package encapsulation 312, the interposer 308 can be more resistant to warpage and bending as the interposer 308 can be supported by the package encapsulation 312.

The interposer pad extensions 326 can be in an array around the recess 342 as a regular, staggered, or differently patterned array. For illustrative purposes, the interposer pad extensions 326 are shown in two rows, although it is understood that any number of rows is possible. For example, there can just be one row, three rows, or as many rows as is possible to fit in the space given pitch and sizing requirements.

The array of the interposer pad extensions 326 can have the extension contact surfaces 328 all coplanar with each other and with the top encapsulation surface 344. The extension contact surfaces 328 of the interposer pad extensions 326 can have a fine pitch because the package encapsulation 312 between the extension contact surfaces 328 will not attract a solder ball on the extension contact surface 328, for example. Pitch is defined as the spacing from center to center of the extension contact surfaces 328. The extension contact surfaces 328 and the package encapsulation 312 together can reduce the chance of a short due to solder bridging between adjacent instances of the extension contact surfaces 328.

The integrated circuit die 310 can be mounted, in the recess 342, on the top interposer surface 324 of the interposer 308 and electrically connected to the interposer 308 using a chip interconnect 332. There can be an upper adhesive 334 between the integrated circuit die 310 and the interposer 308. The upper adhesive is defined as an adhesive material for stabilizing the integrated circuit die 310 on the interposer 308. For example, the upper adhesive 334 can be a die attach adhesive. The upper adhesive 334 can fully cover the non-active side of the integrated circuit die 310. For example, the chip interconnect 332 can be a bond wire or bond ribbon. The chip interconnect 332 can, in this example, contact the active side of the integrated circuit die 310 and connect to the interposer 308 for forming an electrical connection.

The integrated circuit die 310 and the chip interconnect 332 can be encapsulated by a die encapsulation 338 such as a film assisted molding, epoxy molding, or other protective molding. The die encapsulation 338 can contact the portion of the interposer 308 that is exposed in the recess 342 of the package encapsulation 312 and can contact the upper adhesive 334. The die encapsulation 338 can have slanted sides as a result of the molding process, and a planar top surface.

The upper adhesive 334 can extend to or past the edge of the integrated circuit die 310 in order to ensure proper adhesion. The upper adhesive 334 can contact the integrated circuit die 310 and the interposer 308.

The integrated circuit device 314 can be mounted above the integrated circuit die 310 and on the top of the interposer pad extension 326. The integrated circuit device 314 can be connected to the interposer pad extension 326 by a device interconnect 336. The device interconnect 336 is defined as an electrical connector for the integrated circuit device 314 that also provides a support function. For example, the device interconnect 336 can be a solder ball, a conductive column, or a metal pillar.

The integrated circuit device 314 can be in various configurations. For example, the integrated circuit device can be a single chip package, a multiple chip package, a package-in-package, a package-on-package, or other package having active circuitry. In this example, the integrated circuit device 314 can have two chips, with the upper chip smaller than the lower chip, both connected to a device substrate by bond wires. A device encapsulation can cover the chips, the bond wires, and the die attach side of the device substrate. The upper chip and the lower chip of the integrated circuit device 314 can be electrically connected to the base die 306, the integrated circuit die 310, the external interconnect 304, or a combination thereof by being coupled through the interposer pad extension 326.

It has been discovered that the use of the interposer pad extension 326 to create a multi-level package without the use of an additional interposer can reduce the size of the integrated circuit packaging system 300 and can simplify manufacturing and lower cost. For example, because an additional interposer is unnecessary, the height of the integrated circuit packaging system 300 can be less as compared to a package having two interposers. Also for example, as the integrated circuit packaging system 300 only requires one instance of the interposer 308 with the interposer pad extension 326, material costs can also be decreased. Reliability can also be increased due to decreased complexity of the integrated circuit packaging system 300 with the interposer 308 and the recess 342 in the package encapsulation 312.

Figure 4:
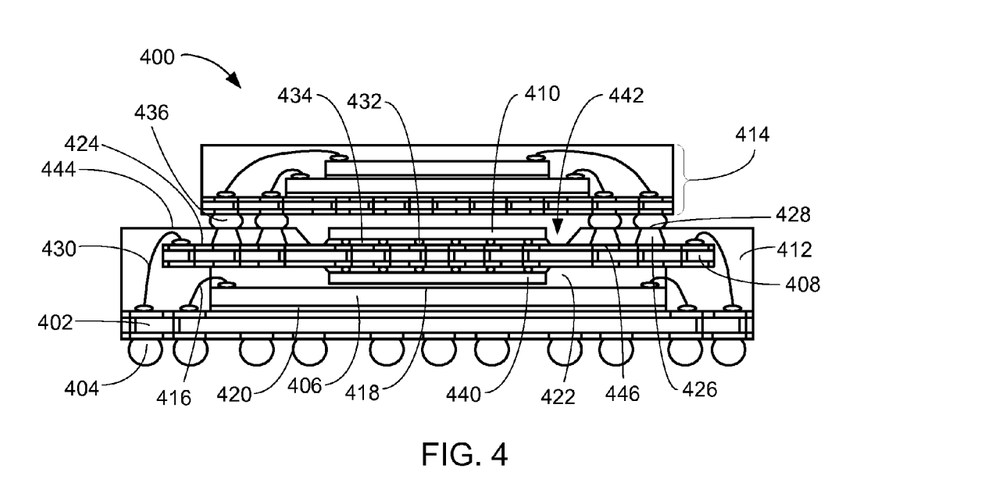
FIG. 4 is a cross-sectional view of an integrated circuit packaging system as exemplified by the bottom view of FIG. 1 and along the section line 2-2 of FIG. 1 in a third embodiment of the present invention.

Referring now to FIG. 4, therein is shown a cross-sectional view of an integrated circuit packaging system 400 as exemplified by the bottom view of FIG. 1 and along the section line 2-2 of FIG. 1 in a third embodiment of the present invention. The integrated circuit packaging system 400 is shown having a chip carrier 402, a base die 406, an interposer 408, an integrated circuit die 410, a package encapsulation 412, and an integrated circuit device 414, as an example.

The chip carrier 402 is defined as a structure containing conductive traces and contacts. For example, the chip carrier 402 can be a laminate substrate, a ceramic substrate, a silicon substrate, a leadframe, or some other structure for redistribution of signals. The external interconnect 404 can be attached to the system side of the chip carrier 402.

The external interconnect 404 is defined as an interface connector for connecting an integrated circuit package to a next level system (not shown). For example, the external interconnect 404 can be a solder ball, a solder bump, a stud bump, a conductive pillar, or other conductive structure.

The base die 406 can be mounted on the chip carrier 402 and connected to the chip carrier 402 with a base interconnect 416. The base interconnect 416 is defined as an electrical connector. For example, the base die 406 can be a wire-bond chip and the base interconnect 416 can be a bond wire or bond ribbon. The base die 406 can have a top die surface 418 such as an active side having active circuitry fabricated thereon. The base die 406 can have a non-active side. The non-active side of the base die 406 can be attached to the chip carrier 402 with a base adhesive 420, such as a die attach adhesive, an adhesive paste, or an underfill. The top die surface 418 of the base die 406 can be connected to the chip carrier 402 by the base interconnect 416. The chip carrier 402 is shown with contacts and vias clearly delineated for illustrative purposes but it is understood that the top and the bottom of the chip carrier 402 are electrically connected through contacts, vias, traces, or other conductive structures.

The top die surface 418 is defined as the surface of the base die 406 facing away from the chip carrier 402. The top die surface 418 can be completely covered by an interposer adhesive 422. The interposer adhesive 422 is defined as a sticky material for attaching components to each other. For example, the interposer adhesive 422 can be a wire-in-film adhesive, which is defined as a B-stage material. For example, the base interconnect 416, such as a bond wire, can be partially embedded in the interposer adhesive 422.

The interposer 408 can attach to the base die 406 with the interposer adhesive 422. The interposer 408 can be positioned on the interposer adhesive 422. The interposer 408 is defined as a structure having contacts and traces for redistributing signals. For example, the interposer 408 can be a laminated substrate, a ceramic substrate, or other structure for redistribution of signals. The interposer 408 can have horizontal dimensions larger than the base die 406. The bottom surface of the interposer 408 can be partially or fully covered by the interposer adhesive 422. The interposer adhesive 422 can fill the available space between the interposer 408 and the base die 406.

For illustrative purposes, the bottom surface of the interposer 408 is shown as being partially covered by the interposer adhesive 422, though it is understood that the interposer adhesive 422 can take different configurations. For example, the bottom surface of the interposer 408 can be fully covered by the interposer adhesive 422. The full coverage of the bottom surface of the interposer 408 can result from applying the interposer adhesive 422 to the interposer 408 before singulation of individual units of the interposer 408 followed by singulation and then mounting the interposer on the base die 406. The preceding process can result in more efficient manufacturing because the amount of the interposer adhesive 422 does not need to be as carefully controlled when applying the interposer adhesive 422 to the interposer 408 before singulation.

The interposer 408 can have a bottom integrated circuit die 440 attached to the side of the interposer 408 facing the base die 406. For example, the bottom integrated circuit die 440 can be a flip chip attached to the interposer 408 by flip chip interconnects such as solder balls. Also for example, the bottom integrated circuit die 440 can have an underfill between the bottom integrated circuit die 440 and the interposer 408 to protect the flip chip interconnects and secure the bottom integrated circuit die 440 to the interposer 408. The bottom integrated circuit die 440 can be embedded in the interposer adhesive 422.

The interposer 408 can have a top interposer surface 424. The top interposer surface 424 is the side of the interposer 408 facing away from the base die 406. The top interposer surface 424 can have an interposer pad extension 426 attached to a contact pad on the periphery of the top interposer surface 424.

The interposer pad extension 426 is defined as an electrically conductive metallic structure attractive to solder which is larger at the bottom than the top. For example, the interposer pad extension 426 can be made from copper or a copper alloy of the same composition as the contact pads on the interposer 408. Also for example, the interposer pad extension 426 can be shaped with slanted sides so that the width of the side contacting the interposer 408 can be larger than the width of the exposed top surface of the interposer pad extension 426. The interposer pad extension 426 can be shaped like a pyramid or a cone with the small end cut off to leave a flat surface parallel to the bottom of the pyramid or the cone.

The interposer pad extension 426 can be formed before being attached to the interposer 408. The interposer pad extension 426 can be attached to a contact pad on the periphery of the top interposer surface 424. The interposer pad extension 426 can be formed and attached in various ways. For example, the interposer pad extension 426 can be formed and attached by masking and plating or depositing, or by forming separately followed by attaching by an adhesive layer.

It has been discovered that the interposer pad extension 426 being formed from the same copper or copper alloy as the contact pads on the interposer 408 can prevent damage from thermal expansion and contraction. For example, because the interposer pad extension 426 has the same coefficient of thermal expansion as the contact pads on the interposer 408, heating and cooling will not cause cracking or separation between the interposer pad extension 426 and the contact pads on the interposer 408.

It has also been discovered that the interposer pad extension 426 being formed from the same copper or copper alloy as the contact pads on the interposer 408 can prevent damage from electromigration. For example, because electromigration will occur more quickly between dissimilar metals, the similar metals of the interposer pad extension 426 and the contact pads on the interposer 408 will alleviate electrolytic damage to the connection between the interposer pad extension 426 and the interposer 408.

It has been further discovered that the interposer pad extension 426 being formed from copper or a copper alloy can prevent inadvertent shorts during reflow of solder on the interposer pad extensions 426. For example, because copper has a higher melting point than solder, the interposer pad extension 426 will remain solid during a reflow process and the attraction of the solder to the interposer pad extension 426 will prevent the solder from bleeding out over the package encapsulation 412 and causing electrical shorts.

The interposer pad extension 426 can include an extension contact surface 428, which is defined to be a top surface of the interposer pad extension 426. The extension contact surface 428 can be exposed from the package encapsulation 412. The extension contact surface 428 can be coated to prevent corrosion with a conductive material such as gold. For example, the surface area of the extension contact surface 428 can be half as large as the surface area of the bottom of the interposer pad extension 426. The extension contact surface 428 can be attractive to solder unlike the package encapsulation 412, which can help prevent electrical shorts from solder bridging between two contacts.

The interposer pad extension 426 can include a lower contact surface 446, which is defined as the bottom surface of the interposer pad extension 426 that connects directly to the interposer 408. The lower contact surface 446 can be larger in surface area than the extension contact surface 428. For example, the lower contact surface 446 can have twice the surface area as the extension contact surface 428.

The interposer 408 can be connected to the chip carrier 402 by an interposer interconnect 430. The interposer interconnect 430 can be on the top interposer surface 424 and the chip carrier 402. For example, the interposer interconnect 430 can be a bond wire or a ribbon bond wire. The interposer interconnect 430 can attach to a contact pad at the edge of the top interposer surface 424. Also for example, the interposer interconnect 430 can be connected on the chip carrier 402 on a contact pad beyond the peripheral edge of the top interposer surface 424.

The interposer 408, the interposer interconnect 430, the interposer pad extension 426, and the base die 406 can be at least partially covered by and can contact the package encapsulation 412. The package encapsulation 412 is defined as a structure on integrated circuit components for electrical and environmental protection and to provide a hermetic seal. For example, the package encapsulation 412 can be a film assisted molding, epoxy molding, or other protective molding, and can protect sensitive components from moisture, dust and other contamination.

The interposer interconnect 430 and the base die 406 can be fully covered by the package encapsulation 412. The top surface of the chip carrier 402 on which the base die 406 is mounted can be fully covered by the package encapsulation 412. The package encapsulation 412 can be formed (or molded) to completely cover the non-horizontal sides of the interposer pad extension 426, which can leave the extension contact surface 428 exposed for connection to other components such as the integrated circuit device 414. The extension contact surface 428 can be coplanar with the top surface of the package encapsulation 412.

The interposer pad extension 426 can be embedded in the package encapsulation 412 in various ways. For example, the interposer pad extension 426 can be pre-formed, attached to the top interposer surface 424, and then covered by the package encapsulation 412 while leaving the extension contact surface 428 exposed. The top of the package encapsulation 412 can be planarized if necessary to expose the top of the interposer pad extension 426.

It has been discovered that the interposer pad extension 426 with the extension contact surface 428 having a surface area that is half of the lower contact surface 446 can help to stabilize the interposer 408 in the package encapsulation 412 and prevent warpage. For example, the shape of the interposer pad extension 426 wider on the bottom than the top can serve a mold locking function.

It has been discovered that forming the package encapsulation 412 on the interposer 408 and the interposer pad extension 426 can prevent resin bleeding during laser ablation. For example, by forming the package encapsulation 412 on the interposer pad extension 426 rather than using a laser to ablate a hole in the package encapsulation 412, there will be no residue to bleed because forming a hole will be unnecessary.

The package encapsulation 412 can cover the periphery of the interposer 408 while leaving the center of the top interposer surface 424 exposed in a recess 442 of the package encapsulation 412. The recess 442 can span a vertical distance from the top interposer surface 424 to the top of the package encapsulation 412.

The recess 442 can have outwardly slanted non-horizontal sides formed by the package encapsulation 412 in order to allow for easier placement of the integrated circuit die 410. The exposed contacts of the interposer 408 in the recess 442 can be used for mounting an integrated circuit, such as the integrated circuit die 410, a flip chip, or a packaged integrated circuit. The package encapsulation 412 can have a top encapsulation surface 444, which is defined as the planar surface of the package encapsulation 412 furthest from the chip carrier 402.

It has been discovered that the package encapsulation 412 covering all but the center of the interposer 408 can allow the use of a thinner substrate material in the construction of the interposer 408. For example, because most of the interposer 408 is surrounded by the package encapsulation 412, the interposer 408 can be more resistant to warpage and bending as the interposer 408 can be supported by the package encapsulation 412.

The interposer pad extensions 426 can be in an array around the recess 442 as a regular, staggered, or differently patterned array. For illustrative purposes, the interposer pad extensions 426 are shown in two rows, although it is understood that any number of rows is possible. For example, there can just be one row, three rows, or as many rows as is possible to fit in the space given pitch and sizing requirements.

The array of the interposer pad extensions 426 can have the extension contact surfaces 428 all coplanar with each other and with the top encapsulation surface 444. The extension contact surfaces 428 of the interposer pad extensions 426 can have a fine pitch because the package encapsulation 412 between the extension contact surfaces 428 will not attract a solder ball on the extension contact surface 428, for example. Pitch is defined as the spacing from center to center of the extension contact surfaces 428. The extension contact surfaces 428 and the package encapsulation 412 together can reduce the chance of a short due to solder bridging between adjacent instances of the extension contact surfaces 428.

The integrated circuit die 410 can be mounted, in the recess 442, on the top interposer surface 424 of the interposer 408 and electrically connected to the interposer 408 using a chip interconnect 432. There can be an upper adhesive 434 between the integrated circuit die 410 and the interposer 408. The upper adhesive is defined as an adhesive material for stabilizing the integrated circuit die 410 on the interposer 408. For example, the upper adhesive 434 can be an underfill. The upper adhesive 434 can surround and support the chip interconnect 432. For example, the chip interconnect 432 can be a solder ball, a conductive bump, or a metal pillar. The chip interconnect 432 can, in this example, be in between and in contact with the integrated circuit die 410 and the interposer 408 for forming an electrical connection.

The integrated circuit die 410 can be mounted opposite the bottom integrated circuit die 440 on the top interposer surface 424. For illustrative purposes, the integrated circuit die 410 is shown the same size and type as the bottom integrated circuit die 440 though it is understood that the integrated circuit die 410 and the bottom integrated circuit die 440 can be different sizes. For example, the bottom integrated circuit die 440 can be larger or smaller than the integrated circuit die 410.

The upper adhesive 434 can extend to or past the edge of the integrated circuit die 410 in order to ensure proper adhesion. The upper adhesive 434 can contact the integrated circuit die 410 and the interposer 408 and can, but does not have to, contact the package encapsulation 412.

The integrated circuit device 414 can be mounted above the integrated circuit die 410 and on the top of the interposer pad extension 426. The integrated circuit device 414 can be connected to the interposer pad extension 426 by a device interconnect 436. The device interconnect 436 is defined as an electrical connector for the integrated circuit device 414 that also provides a support function. For example, the device interconnect 436 can be a solder ball, a conductive column, or a metal pillar.

The integrated circuit device 414 can be in various configurations. For example, the integrated circuit device can be a single chip package, a multiple chip package, a package-in-package, a package-on-package, or other package having active circuitry. In this example, the integrated circuit device 414 can have two chips, with the upper chip smaller than the lower chip, both connected to a device substrate by bond wires. A device encapsulation can cover the chips, the bond wires, and the die attach side of the device substrate. The upper chip and the lower chip of the integrated circuit device 414 can be electrically connected to the base die 406, the integrated circuit die 410, the external interconnect 404, or a combination thereof by being coupled through the interposer pad extension 426.

It has been discovered that the use of the interposer pad extension 426 to create a multi-level package without the use of an additional interposer can reduce the size of the integrated circuit packaging system 400 and can simplify manufacturing and lower cost. For example, because an additional interposer is unnecessary, the height of the integrated circuit packaging system 400 can be less as compared to a package having two interposers. Also for example, as the integrated circuit packaging system 400 only requires one instance of the interposer 408 with the interposer pad extension 426, material costs can also be decreased. Reliability can also be increased due to decreased complexity of the integrated circuit packaging system 400 with the interposer 408 and the recess 442 in the package encapsulation 412.

Figure 5:
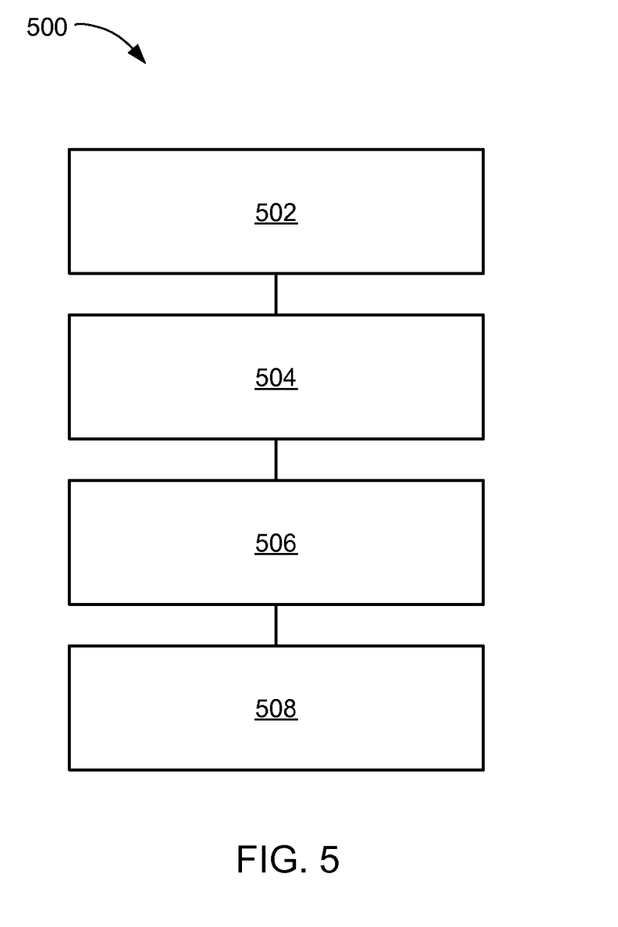
FIG. 5 is a flow chart of a method of manufacture of the integrated circuit packaging system in a further embodiment of the present invention.

Referring now to FIG. 5, therein is shown a flow chart of a method 500 of manufacture of an integrated circuit packaging system in a further embodiment of the present invention. The method 500 includes: providing a substrate in a block 502; mounting an interposer having a top interposer surface over the substrate in a block 504; attaching an interposer pad extension to the top interposer surface, the interposer pad extension having an extension contact surface and a lower contact surface, the surface area of the extension contact surface being smaller than the surface area of the lower contact surface in a block 506; and forming a package encapsulation on the substrate, the interposer, and the interposer pad extension, the package encapsulation having a recess exposing the top interposer surface, the interposer pad extension embedded only in the package encapsulation in a block 508.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    a substrate;
    an interposer over the substrate, the interposer having a top interposer surface;
    an interposer pad extension attached to the top interposer surface, the interposer pad extension having an extension contact surface and a lower contact surface, the surface area of the extension contact surface being smaller than the surface area of the lower contact surface; and
    a package encapsulation on the substrate, the interposer, and the interposer pad extension, the package encapsulation having a recess exposing the top interposer surface, the interposer pad extension embedded only in the package encapsulation
    a base die mounted on the substrate;
    an interposer adhesive on the base die and the interposer, the interposer adhesive filling the space between the interposer and the base die;
    an interposer interconnect on the top interposer surface and the substrate; and
    an integrated circuit die mounted on the interposer in the recess;
    wherein: the interposer pad extension is exposed from the package encapsulation.

2. The system as claimed in claim 1 further comprising an integrated circuit die mounted on the interposer in the recess.

3. The system as claimed in claim 1 further comprising:
    a base die mounted on the substrate; and
    an interposer adhesive on the base die and the interposer, the interposer adhesive filling the space between the interposer and the base die.

4. The system as claimed in claim 1 wherein the interposer pad extension is exposed from the package encapsulation.

5. The system as claimed in claim 1 further comprising an interposer interconnect on the top interposer surface and the substrate.

6. The system as claimed in claim 1 further comprising an integrated circuit device mounted on the interposer pad extension.

7. The system as claimed in claim 1 wherein the integrated circuit die mounted on the interposer includes:
    a chip interconnect on the integrated circuit die and the interposer; and
    an upper adhesive between and on the integrated circuit die and the interposer.

8. The system as claimed in claim 1 wherein the integrated circuit die mounted on the interposer includes:
    a chip interconnect on the integrated circuit die and the interposer;
    an upper adhesive between and on the integrated circuit die and the interposer; and
    a die encapsulation on the integrated circuit die and the chip interconnect.

9. The system as claimed in claim 1 wherein the package encapsulation has a top encapsulation surface coplanar with the extension contact surface.

* * * * *